United States Patent
Cheng et al.

(10) Patent No.: US 6,936,486 B2
(45) Date of Patent: Aug. 30, 2005

(54) LOW VOLTAGE MULTI-JUNCTION VERTICAL CAVITY SURFACE EMITTING LASER

(75) Inventors: Julian Cheng, San Jose, CA (US); Chan-Long Shieh, Paradise Valley, AZ (US); Guoli Liu, Camarillo, CA (US); Medicharla Venkata Ramana Murty, Woodland Hills, CA (US)

(73) Assignee: JDSU Uniphase Corporation, San Jose, CA (US)

( * ) Notice: Subject to any disclaimer, the term of this patent is extended or adjusted under 35 U.S.C. 154(b) by 134 days.

(21) Appl. No.: 10/299,387

(22) Filed: Nov. 19, 2002

(65) Prior Publication Data

US 2004/0095978 A1 May 20, 2004

(51) Int. Cl.[7] .............................................. H01L 21/00
(52) U.S. Cl. ............................. 438/22; 438/31; 438/39; 438/42
(58) Field of Search ................................ 438/22, 31, 39, 438/41, 42, 44, 46, 47; 372/43, 44, 45, 46, 50, 96

(56) References Cited

U.S. PATENT DOCUMENTS

| | | | | |
|---|---|---|---|---|
| 5,404,373 A | * | 4/1995 | Cheng .......................... | 372/50 |
| 5,747,366 A | * | 5/1998 | Brillouet et al. .............. | 438/44 |
| 5,757,836 A | * | 5/1998 | Jiang et al. ................... | 372/96 |
| 6,014,400 A | * | 1/2000 | Kobayashi .................... | 372/96 |
| 6,208,680 B1 | * | 3/2001 | Chirovsky et al. ............ | 372/96 |
| 6,393,038 B1 | * | 5/2002 | Raymond et al. ............. | 372/50 |
| 6,542,530 B1 | * | 4/2003 | Shieh et al. ................... | 372/46 |
| 6,628,685 B1 | * | 9/2003 | Shieh ............................ | 372/45 |
| 6,642,070 B2 | * | 11/2003 | Jiang et al. ................... | 438/22 |
| 2002/0030198 A1 | | 3/2002 | Coman et al. ............... | 257/103 |

* cited by examiner

Primary Examiner—Kevin M. Picardat
(74) Attorney, Agent, or Firm—Parsons & Goltry; Robert A. Parsons; Michael W. Goltry (57) ABSTRACT

An optical device with a wavelength of operation, the device comprising a light emitting region which emits light at the wavelength of operation, the light emitting region including an active region and a contact region of a first conductivity type and a second conductivity type wherein the light emitting region is positioned within an optical gain cavity which includes a mirror and an opposed mirror and a substrate solder bonded using a bonding layer to at least one of the mirror and the opposed mirror.

31 Claims, 9 Drawing Sheets

LOW VOLTAGE MULTI-JUNCTION VERTICAL CAVITY SURFACE EMITTING LASER

FIELD OF THE INVENTION

This invention relates to lasers.

More particularly, the present invention relates to semiconductor lasers that generate relatively long wavelengths.

BACKGROUND OF THE INVENTION

Vertical cavity surface emitting lasers (hereinafter referred to as "VCSEL's") have become the dominant light source for optical transmitters used in short-reach local area networks and storage area network applications, in which a multi-mode optical fiber is used for data transmission. VCSEL's are low cost micro-cavity devices with high speed, low drive current and low power dissipation, with desirable beam properties that significantly simplify their optical packaging and testing. In order to extend the application of VCSEL's to optical networks with a longer reach, e.g., in Metropolitan Area Networks that are based on single-mode optical fibers, a long wavelength VCSEL is needed that can emit sufficiently high single mode output power in the 1.3 μm to 1.5 μm wavelength range.

The simultaneous requirement of high power and single mode lasing operation create an inherent contradiction in the VCSEL design. Whereas high power requires a large effective gain volume, single mode operation mandates a smaller active area that is typically less than 5 μm in cross section. This contradiction may be resolved by increasing the longitudinal extent of the gain volume while restricting its lateral area, but in practice this approach is limited by the diffusion lengths of the injected electrical carriers, which limit the thickness of the gain volume. This, along with the stronger temperature dependence of the lasing mode and the gain peak at longer wavelengths, has effectively limited the maximum single mode output power of a long wavelength VCSEL to 1 mW or less before the onset of thermal roll-over.

The use of multiple quantum well stacks arranged in a resonant gain configuration (with the quantum wells located at the anti-nodes) can greatly increase the gain volume and total optical of the VCSEL, but in practice this is limited by carrier diffusion to a single MQW stack. One approach for circumventing the carrier diffusion limit is to electrically cascade successive pn junctions formed by embedding individual gain regions (MQW stacks) between p-doped and n-doped contact layers. The successive pn junctions are electrically "shorted" and thus serially connected by means of Esaki tunnel junctions connecting neighboring $p^+$-doped and $n^+$-doped contact layers. While this approach can result in a higher optical output and differential slope efficiencies that exceed 100%, its principal drawback is the additive nature of the junction voltages, which require the use of high voltage drivers that are not readily available at high modulation speeds.

It would be highly advantageous, therefore, to remedy the foregoing and other deficiencies inherent in the prior art.

Accordingly, it is an object of the present invention to provide a new and improved method of fabricating an electrically pumped long wavelength vertical cavity surface emitting laser.

It is an object of the present invention to provide a new and improved method of fabricating an electrically pumped long wavelength vertical cavity surface emitting laser which operates at lower power.

It is another object of the present invention to provide a new and improved method of fabricating an electrically pumped long wavelength vertical cavity surface emitting laser which has improved light emission properties.

It is another object of the present invention to provide a new and improved method of fabricating an electrically pumped long wavelength vertical cavity surface emitting laser which generates less heat.

It is still another object of the present invention to provide a new method of improving the temperature performance of an electrically pumped long wavelength vertical cavity surface emitting laser which has a reduced temperature dependence.

SUMMARY OF THE INVENTION

To achieve the objects and advantages specified above and others, a method of fabricating a multi-junction vertical cavity surface emitting laser with a wavelength of operation is disclosed. The method comprises the steps of providing a first substrate onto which at least one light emitting region is epitaxially grown. In the preferred embodiment, the first substrate includes indium phosphide (InP). However, it will be understood that the first substrate can include other materials which can be lattice matched to subsequent layers grown thereon.

The light emitting region includes an active region with a plurality of quantum structure layers which substantially emit light at the wavelength of operation. In the preferred embodiment, each adjacent quantum structure layer in the active region is spaced apart by a distance approximately equal to an integer multiple of one-half the wavelength of operation.

Further, each light emitting region is separated from each adjacent light emitting region by alternate contact regions of a first conductivity type and a second conductivity type so that each light emitting region can be electrically biased in parallel. In the preferred embodiment, the first conductivity type is opposite in conductivity to the second conductivity type such that each at least one light emitting region is sandwiched between contact regions of opposite conductivity types (i.e. n-type and p-type regions to form a pn junction).

A first stack of alternate layers of a first material and a second material is epitaxially grown on the light emitting region wherein the first stack of alternate layers form a distributed Bragg reflector (hereinafter referred to as "DBR"). A second substrate is bonded to the first stack of alternate layers and the first substrate is removed by lapping or a similar technique to substantially expose the light emitting region. In the preferred embodiment, the second substrate includes indium phosphide (InP). However, it will be understood that the second substrate can include other materials with suitable thermally conductive properties such as gallium arsenide (GaAs), silicon (Si), or the like. The second substrate can be bonded using a bonding layer of a solder material, for example, or another suitable material with the desired properties for adhesion. In some embodiments, the bonding layer can include a window to allow a substantial light emission through the second substrate.

A second stack of alternate layers of a third material and a fourth material is epitaxially grown on the at least one light emitting region to form a DBR. In the preferred embodiment, the third and fourth materials include a high index of refraction material, such as magnesium fluoride (MgF) and zinc selenide (ZnSe), respectively, to form a dielectric DBR. However, the first, second third, and fourth material layers can include other materials, such as alloys of AlGaAs, silicon oxide (SiO), titanium oxide (TiO), or the like. Further, the first, second third, and fourth material layers each have a thickness approximately equal to one quarter of the wavelength of operation.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

DETAILED DESCRIPTION OF THE PREFERRED EMBODIMENT

Figure 1:
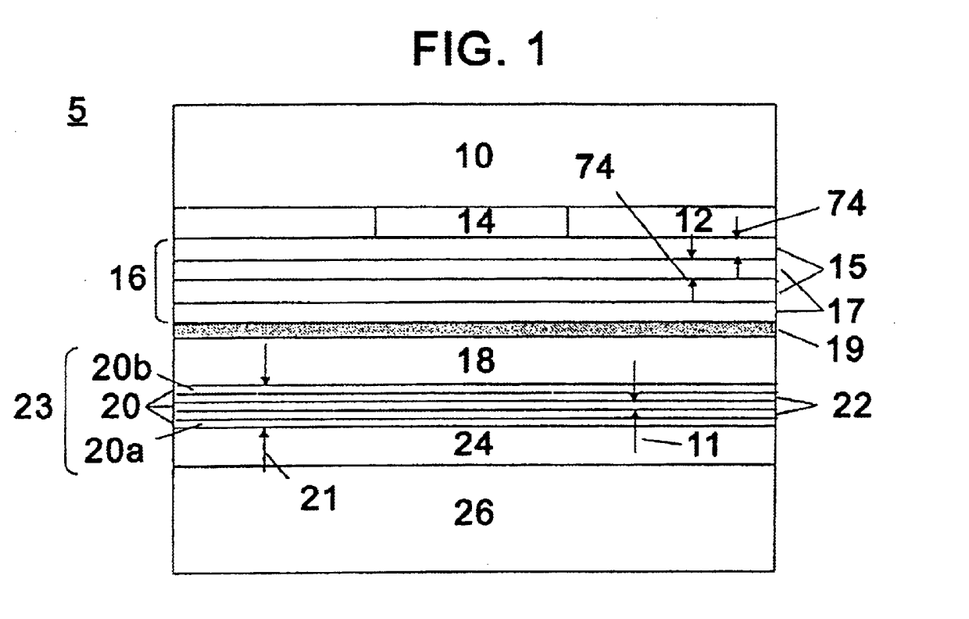
FIG. 1 is a sectional view of a step in the fabrication of a single junction vertical cavity surface emitting laser in accordance with the present invention.

Turn now to FIG. 1 which illustrates a step in the fabrication of a single junction vertical cavity surface emitting laser 5 with a wavelength of operation in accordance with the present invention. It will be understood that we are illustrating a single VCSEL 5 although generally a plurality of VCSEL's are deposited or grown in blanket layers over an entire wafer so that a large number of VCSEL's are fabricated simultaneously.

The method of fabricating single junction VCSEL 5 includes providing a substrate 26 onto which at least one light emitting region 23 is epitaxially grown. In this embodiment, we are illustrating a single light emitting region 23 for simplicity and ease of discussion. In the preferred embodiment, substrate 26 includes indium phosphide (InP). However, it will be understood that substrate 26 can include other materials, such as gallium aresenide (GaAs) or the like, which can be lattice matched with subsequent layers grown thereon.

Light emitting region 23 includes an active region 21 with a plurality of quantum structure layers 22 with a band gap wavelength wherein each quantum structure layer 22 substantially emits light at the wavelength of operation. In the preferred embodiment, the wavelength of operation is in a range given approximately from 1.2 μm to 1.6 μm which is typically used in optical communication applications, such as fiber optical networks. However, it will be understood that other wavelength ranges may be suitable for a given application.

In the preferred embodiment, active region 21 is sandwiched between a cladding layer 18 and a cladding layer 24. It will be understood that while cladding layers 18 and 24 are illustrated as including a single material layer, layers 18 and 24 can each include more than one layer. Further, in the preferred embodiment, cladding layers 18 and 24 include indium phosphide wherein cladding layer 18 is lightly doped n-type and cladding layer 24 is lightly doped p-type. However, it will be understood that layers 18 and 24 can include other suitable cladding materials with various doping configurations.

In the preferred embodiment, quantum structure layers 22 include quantum wells. However, it will be understood that layers 22 can include other device structures, such as quantum dots or similar device structures with suitable light emission properties. In the preferred embodiment, each adjacent quantum structure layer 22 in active region 21 is spaced apart by a distance 11 chosen such that quantum structures layers 22 are substantially at an anti-node of an optical field in VCSEL 5 (i.e. distance 11 is approximately equal to one half the wavelength of operation or integer multiples thereof).

Further, adjacent quantum structure layers 22 are separated by a barrier layer 20 as illustrated such that a barrier layer 20a is positioned adjacent to cladding layer 24 and a barrier layer 20b is positioned adjacent to cladding layer 18. In the preferred embodiment, an energy gap wavelength of each barrier layer 20 is smaller than the energy gap wavelength of each quantum structure layer 22. Further, in the preferred embodiment, quantum structure layers 22 and barrier layers 20 include alloys of AlGaInAs (i.e. InAlAs, InGaAs, etc.). However, it will be understood that quantum structure layers 22 and barrier layers 20 can include other suitable light emitting materials and barrier materials, respectively.

It will be understood that in some embodiments, barrier layer 20a positioned adjacent to cladding layer 24 can include a sufficiently low electron affinity material in order to provide improved electron confinement for active region 21. Further, in some embodiments, barrier layer 20b adjacent to cladding layer 18 can include a sufficiently high ionization potential material to provide improved hole confinement. The addition of barrier layers 20a and 20b provides a higher energy barrier against carrier leakage and carrier loss, and improves a high temperature performance of VCSEL 5.

A contact region 19 is positioned on light emitting region 23 adjacent to cladding layer 18. In the preferred embodiment, contact region 19 includes highly n-type doped indium phosphide (InP). However, it will be understood that contact region 19 can include other suitable contact materials. Further, contact region 19 is illustrated as including a single layer for simplicity and illustrative purposes. However, it will be understood that contact region 19 can include multiple conductive layers.

A metamorphic DBR region 16 is epitaxially grown on contact region 19. In the preferred embodiment, metamorphic DBR region 16 includes alternate layers of an AlAs layer 15 and a GaAs layer 17. However, it will be understood that layers 15 and 17 can include other suitable reflective materials that are stacked alternately between a high and a low index of refraction. Further, in the preferred embodiment, each layer 15 and 17 has a thickness 74 approximately equal to one quarter of the wavelength of operation to provide a desired reflective property. Metamorphic DBR region 16 behaves as a heat spreading region. The higher thermal conductivity of binary compounds in metamorphic DBR region 16 provides a lower thermal resistance and better high temperature performance for single junction VCSEL 5.

A substrate 10 is bonded to metamorphic DBR region 16. In the preferred embodiment, substrate 10 includes indium phosphide (InP). However, it will be understood that substrate 10 can include other suitable substrate materials, such as gallium arsenide (GaAs), silicon (Si), or other suitable supporting materials with a desired property for thermal conductivity, such as a heatsink or the like. Substrate 10 can be bonded to region 16 using techniques well known to those skilled in the art. In the preferred embodiment, substrate 10 is bonded to region 16 using a bonding layer 12 which includes a solder material such as gold/silicon (Au/Si), gold/tin (Au/Sn), gold/germanium (AuGe), or the like. In the preferred embodiment, bonding layer 12 includes a window 14 to allow light emission from light emitting region 23 as will be discussed separately.

Figure 2:
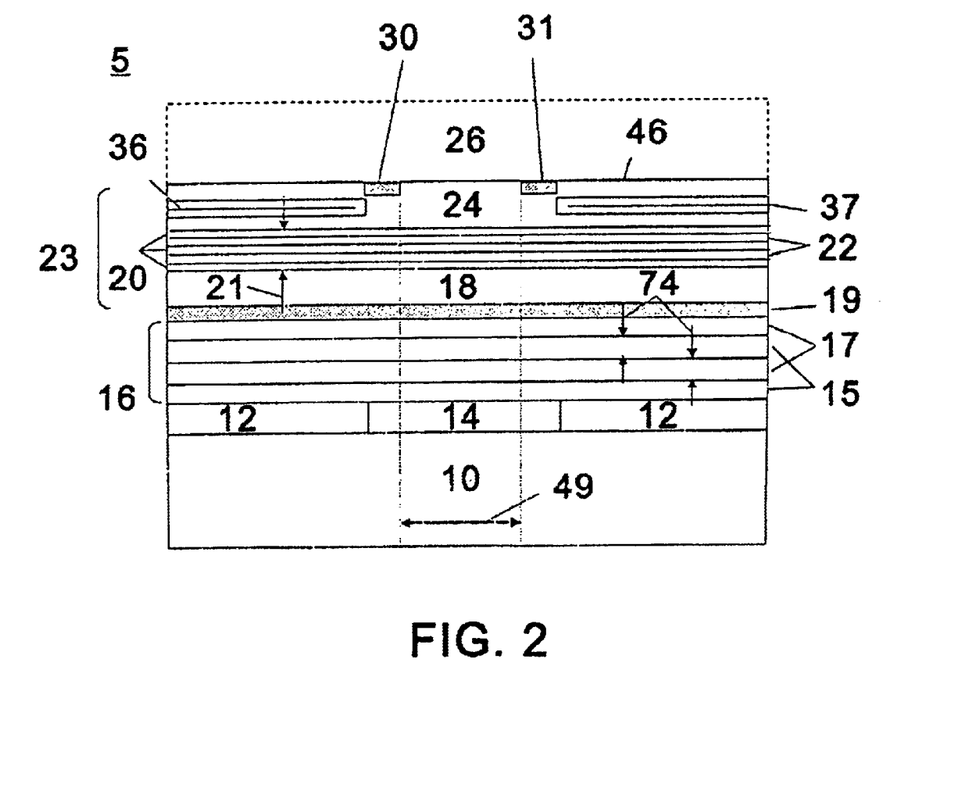
FIG. 2 is a sectional view of a step in the fabrication of the single junction vertical cavity surface emitting laser in accordance with the present invention.

Turn now to FIG. 2 which illustrates another step in the fabrication of single junction VCSEL 5. In FIG. 2, substrate 26 is substantially removed to expose a surface 46 of light emitting region 23 by any technique well known to those skilled in the art, such as lapping or the like. Further, in the preferred embodiment an implant region 36 and 37 are formed within cladding layer 24 and aligned such that an electrically conductive channel is formed which substantially overlaps the light path channel 49 that extends through light emitting region 23, metamorphic DBR region 16, and substrate 10, as will be discussed separately. In the preferred embodiment, an index guide region 30 and 31 are positioned within cladding layer 24 adjacent to surface 46 and aligned with window 14 and light path channel 49. Index guide regions 30 and 31 can include, for example, a trench.

Implant regions 36 and 37 are used to substantially confine an electrical current to light path channel 49 to improve a single mode lasing operation. Hence, ion implantation is used to bombard some of the surrounding cladding layer 24 in order to create a region of higher resistivity, and, thereby channel a substantial amount of the electrical current into the relatively more conductive light path channel 49. However, it will be understood that implant regions 36 and 37 and index guide regions 30 and 31 are optional, but included in the preferred embodiment for illustrative purposes.

The implanted ions may consist of singly-charged protons ($H^+$), singley-charged helium ions ($He^+$), doubly-charged helium ions ($He^{++}$), or the like. The higher resistivity substantially results from the deep levels created by the implant damage, whose energy states favor the compensation of cladding region 24. It will be understood that a similar implant region could be created within cladding layer 18 and adjacent to light path channel 49.

Index guide regions 30 and 31 are used to improve a single-mode output power of single junction VCSEL 5 by increasing the lateral cross-section of the gain region while preserving single-mode lasing operation by means of mode selection measures (mode control) that preferentially enhance a modal gain of one mode through index guiding, or alternatively suppress the other competing higher order modes through higher reflection loss. By allowing the actively pumped area to increase while suppressing the competing modes that emerge through surface relief patterning, higher single-mode output power is achieved through a reduced current density, which leads to lower self-heating and reduced gain saturation.

Figure 3:
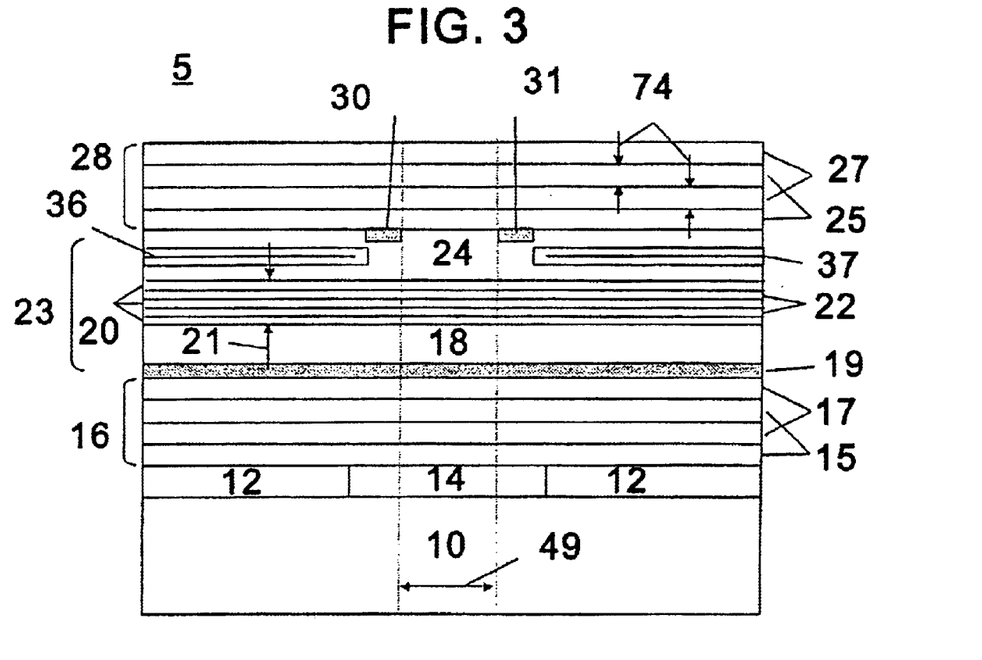
FIG. 3 is a sectional view of another step in the fabrication of the single junction vertical cavity surface emitting laser in accordance with the present invention.

Turn now to FIG. 3 which illustrates another step in the fabrication of single junction VCSEL 5. In FIG. 3 and in the preferred embodiment, a dielectric DBR region 28 is positioned on light emitting region 23 and adjacent to cladding region 24 by using a dielectric lift-off process. However, it will be understood that dielectric DBR region 28 can be deposited using other deposition techniques well know to those skilled in the art. In the preferred embodiment, dielectric DBR region 28 includes alternate layers of a silicon oxide (SiO) layer 25 and a titanium oxide (TiO) layer 27 wherein each layer 25 and 27 has thickness 74 approximately equal to one quarter of the wavelength of operation to obtain a desired reflective property.

However, it will be understood that layers 25 and 27 can include other suitable dielectric materials of alternate layers of a high dielectric constant material and a low dielectric constant material, such as alternate layers of magnesium fluoride (MgF) and zinc selenide (ZnSe). Further, it will be understood that the use of a dielectric DBR region in this embodiment is for illustrative purposes only. For example DBR region 28 could include alternate layers of aluminum arsenide (AlAs) and gallium arsenide (GaAs) and be similar in structure to metamorphic DBR region 16.

Figure 4:
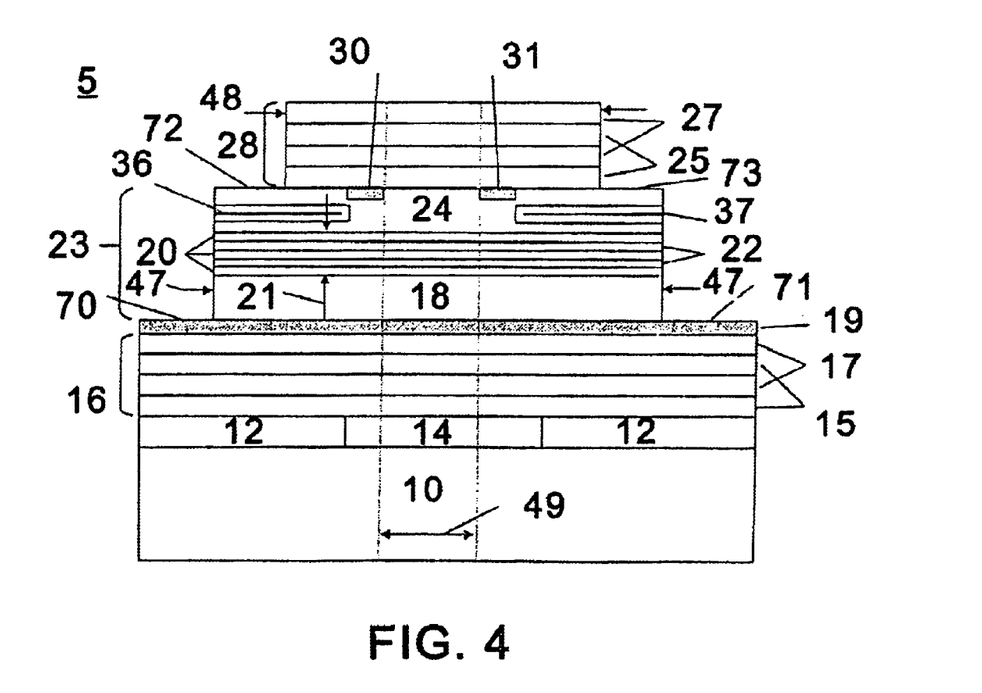
FIG. 4 is a sectional view of still another step in the fabrication of the single junction vertical cavity surface emitting laser in accordance with the present invention.

Turn now to FIG. 4 which illustrates another step in the fabrication of single junction VCSEL 5. In FIG. 4, light emitting region 23 and dielectric DBR region 28 are etched through contact region 19 to form a mesa 47 and expose a surface 70 and a surface 71. Further, dielectric DBR region 28 is etched through light emitting region 23 to form a mesa 48 and expose a surface 72 and 73.

Figure 5:
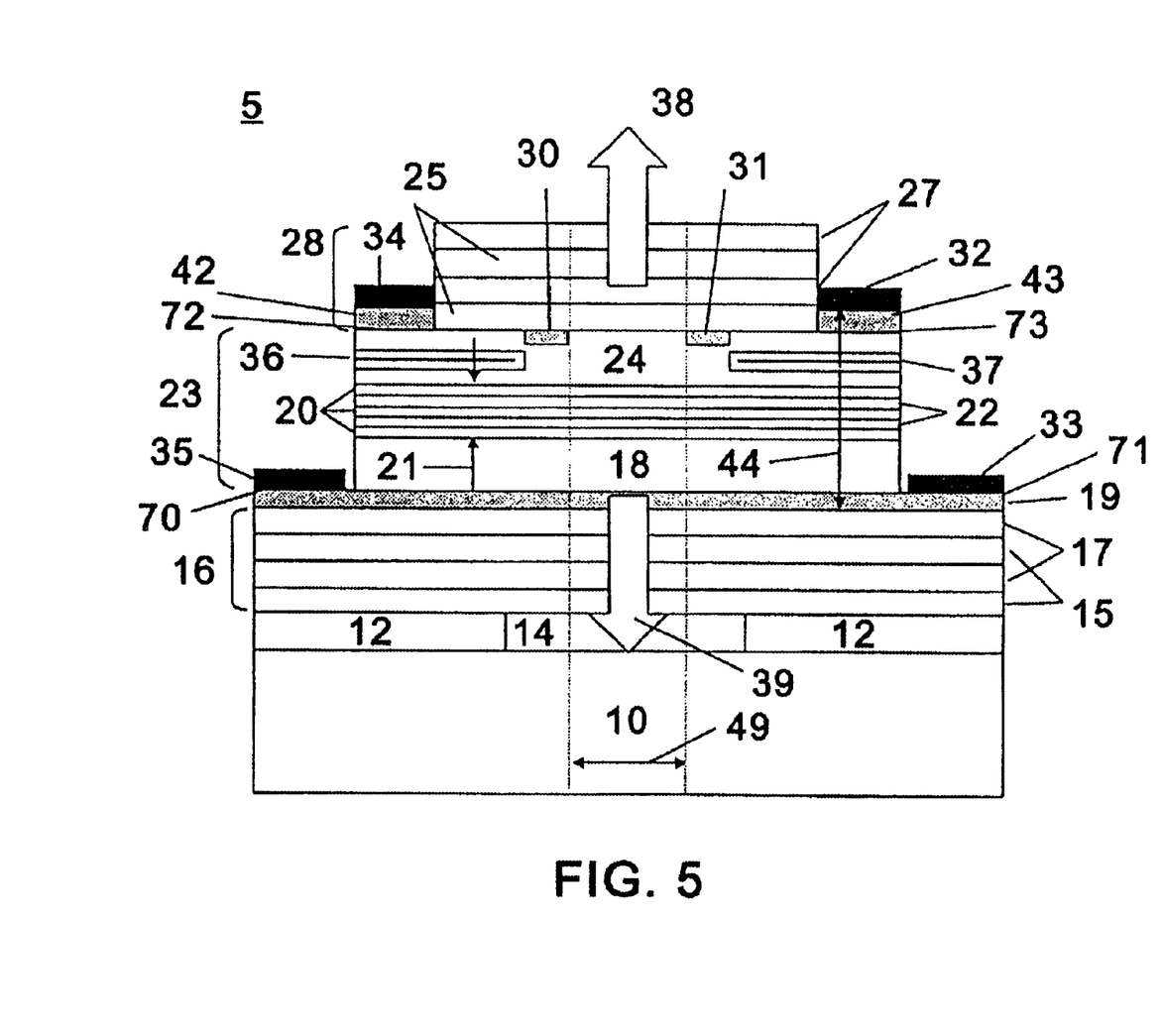
FIG. 5 is a sectional view of a step in the fabrication of the single junction vertical cavity surface emitting laser in accordance with the present invention.

Turn now to FIG. 5 which illustrates another step in the fabrication of single junction VCSEL 5. In FIG. 5, an electrical contact 35 and 33 are deposited on surface 70 and 71, respectively. It will be understood that electrical contacts 33 and 35 can include gold (Au), platinum (Pt), silver (Ag), or the like. Further, it will be understood that while contact layers 33 and 35 are illustrated as including a single layer, layers 33 and 35 could include multiple conductive layers of conductive materials.

In the preferred embodiment, a contact layer 42 and 43 are epitaxially deposited on surfaces 72 and 73, respectively. In the preferred embodiment, contact layers 42 and 43 include highly p-type doped InGaAs. However, it will be understood that layers 42 and 43 can include other suitable conductive materials. Further, an electrical contact 34 is positioned on contact layer 42 and an electrical contact 32 is positioned on contact layer 43 to form a pn junction 44 between electrical contacts 70 and/or 71 and electrical contacts 32 and/or 34 as illustrated wherein pn junction 44 emits light 38 and light 39.

It will be understood that electrical contacts 32 and 34 can include gold (Au), platinum (Pt), silver (Ag), or the like. It will also be understood that in the preferred embodiment, layers 42, 43, and 24 are p-type doped and layers 19 and 18 are n-type doped for illustrative purposes and that other doping configurations are possible. For example, layers 42, 43, and 24 could be n-type doped and layers 19 and 18 could be p-type doped wherein a polarity of pn junction 44 is reversed.

Figure 6:
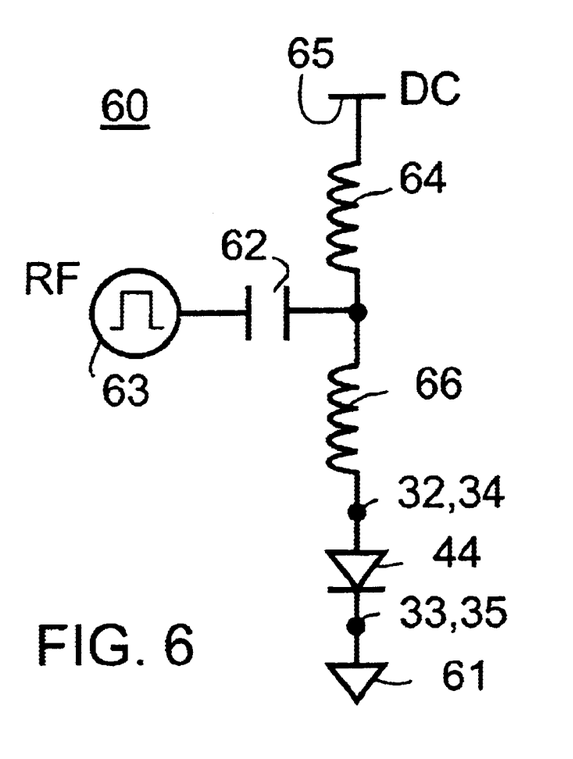
FIG. 6 is a circuit schematic of an electro-optic circuit of the single junction vertical cavity surface emitting laser connected to electronic modulation circuitry in accordance with the present invention.

Turn now to FIG. 6 which illustrates an electrooptic circuit 60 of single junction VCSEL 5 connected to electronic modulation circuitry. In circuit 60, electrical contacts 33 and 35 (See FIG. 5) are electrically connected to an electrical power return 61. Further, electrical contacts 32 and 34 (See FIG. 5) are electrically connected to a terminal of a resistor 66. An opposed terminal of resistor 66 is electrically connected to a terminal of a capacitor 62 and a terminal of an inductor 64, as in a "bias tee". An opposed terminal of capacitor 62 is electrically connected to an RF power source 63. An opposed terminal of inductor 64 is electrically connected to a DC power source 65. It will be understood that electrooptic circuit 60 could be formed as an integrated circuit or could include a combination of integrated and discrete electronic components.

In circuit 60, DC power source 65 biases pn junction 44 with a DC voltage. Inductor 64 provides an electrical short for DC signals and a high impedance to RF signals. Resistor 66 added in series with diode 44 behaves as a current limiter or an impedance matching element, and capacitor 62 isolates RF power source 63 from a DC current. RF power source 63 provides an RF voltage which modulates pn junction 44.

It is highly desirable to form a plurality of light emitting regions 23 to enhance light emission. Further, it is desirable to increase light emission without dramatically increasing power consumption and the generation of heat. To accomplish these objects, a multi-junction VCSEL is formed in which light emitting regions are biased in a parallel manner in order to achieve low bias voltage operation and minimal heat generation.

Figure 7:
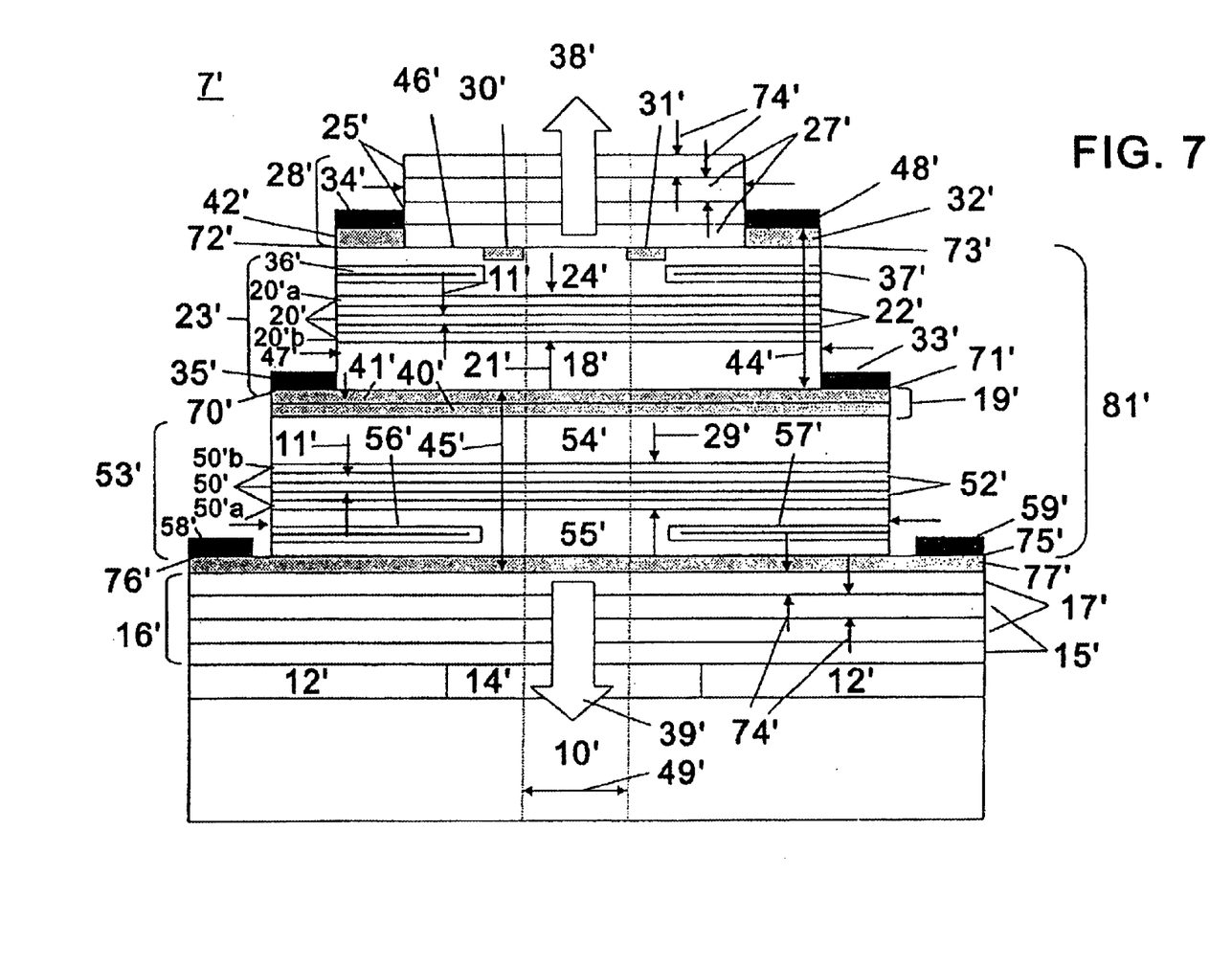
FIG. 7 is a sectional view of a step in the fabrication of a multi-junction vertical cavity surface emitting laser in accordance with the present invention.

Turn now to FIG. 7 which illustrates a multijunction VCSEL 7' with a wavelength of operation configured to allow improved light emission with lower power consumption. It will be understood that multijunction VCSEL 7' is fabricated using similar steps in the fabrication sequence for single junction VCSEL 5 (i.e. substrate bonding, substrate removal, etc.). However, we are illustrating the final device structure in FIG. 7 for simplicity and ease of discussion. Further, multijunction VCSEL 7' includes two active regions for simplicity and ease of discussion. However, it will be understood that multijunction VCSEL 7' can include more than two light emitting regions electrically connected in parallel.

Multijunction VCSEL 7' includes a substrate 10'. In the preferred embodiment, substrate 10' includes indium phosphide (InP). However, it will be understood that substrate 10' can include other suitable substrate materials, such as gallium arsenide (GaAs), silicon (Si), or other suitable supporting materials with the desired properties for thermal conductivity, such as a heatsink or the like. In the preferred embodiment, substrate 10' is bonded to region 16' using a bonding layer 12' which includes solder such as gold/silicon (Au/Si), gold/tin (Au/Sn), gold/germanium (Au/Ge), or the like. Bonding layer 12' includes a window 14' to allow light emission from an active regions 21' and 29' as will be discussed separately.

In the preferred embodiment, metamorphic DBR region 16' includes alternate layers of an AlAs layer 15' and a GaAs layer 17' wherein each layer 15' and 17' has a thickness 74' approximately equal to one quarter of the wavelength of operation to obtain a desired reflective property. However, it will be understood that layers 15' and 17' can include other suitable reflective materials that are stacked alternately between a high and a low index of refraction. Metamorphic DBR region 16' behaves as a heat spreading region. The higher thermal conductivity of binary compounds in metamorphic DBR region 16' provide a lower thermal resistance and better high temperature performance for multifunction VCSEL 7'.

A contact region 77' is positioned on metamorphic DBR region 16'. In the preferred embodiment, contact region 77' includes highly n-type doped InP. However, it will be understood that contact region 77' can include other suitable contact materials. Further, contact region 77' is illustrated as including a single layer for simplicity and illustrative purposes. However, it will be understood that contact region 77' can include multiple conductive layers.

A light emitting region 53' is positioned on contact layer 77'. Light emitting region 53' includes active region 29' with a plurality of quantum structure layers 52' with a band gap wavelength wherein each quantum structure layer 52' substantially emits light at the wavelength of operation. In the preferred embodiment, the wavelength of operation is in a range given approximately from 1.2 $\mu$m to 1.6 $\mu$m which is typically used in optical communication applications, such as fiber optical networks. However, it will be understood that other wavelength ranges may be suitable for a given application.

In the preferred embodiment, active region 29' is sandwiched between a cladding layer 55' and a cladding layer 54'. It will be understood that while cladding layers 54' and 55' are illustrated as including a single material layer, layers 54' and 55' can each include more than one layer. Further, in the preferred embodiment, cladding layers 54' and 55' include indium phosphide wherein cladding layer 54' is lightly doped n-type and cladding layer 55' is lightly doped p-type. However, it will be understood that layers 54' and 55' can include other suitable cladding materials with various doping configurations.

In the preferred embodiment, quantum structure layers 52' include quantum wells. However, it will be understood that layers 52' can include other device structures, such as quantum dots or similar device structures with suitable light emission properties. In the preferred embodiment, each adjacent quantum structure layer 52' in active region 29' is spaced apart by a distance 11' chosen such that quantum structures layers 52' are substantially at an anti-node of an optical field in VCSEL 5 (i.e. distance 11' is approximately equal to one half the wavelength of operation or integer multiples thereof).

Further, adjacent quantum structure layers 52' are separated by a barrier layer 50' as illustrated such that a barrier layer 50'a and 50'b is positioned adjacent to cladding layers 55' and 54', respectively. In the preferred embodiment, an energy gap wavelength of each barrier layer 50' is smaller than the energy gap wavelength of each quantum structure layer 52'. Further, in the preferred embodiment, quantum structure layers 52' and barrier layers 50' include alloys of AlGaInAs (i.e. InAlAs, InGaAs, etc.). However, it will be understood that quantum structure layers 52' and barrier layers 50' can include other suitable light emitting materials and barrier materials, respectively.

It will be understood that in some embodiments, barrier layer 50'a positioned adjacent to cladding layer 55' can include a sufficiently low electron affinity material in order to provide improved electron confinement for active region 29'. Further, in some embodiments, barrier layer 50'b adjacent to cladding layer 54' can include a sufficiently high ionization potential material to provide improved hole confinement. The addition of barrier layers 50'a and 50'b provides a higher energy barrier against carrier leakage and carrier loss, and improves a high temperature performance of VCSEL 5.

A contact region 19' is positioned on light emitting region 53'. Contact region 19' includes a contact layer 40' positioned on cladding layer 54' and a contact layer 41' positioned on contact layer 40'. However, it will be understood that contact region 19' can include a number of layers greater than one with various doping configurations. In the preferred embodiment, contact layer 40' includes p-type doped indium phosphide (InP) and contact layer 41' includes p-type doped aluminum gallium indium arsenide (AlGaInAs) wherein the doping concentration of contact layer 41' is substantially greater than the doping concentration of contact layer 40'.

A light emitting region 23' is positioned on contact region 19'. Light emitting region 23' includes active region 21' with a plurality of quantum structure layers 22' with a band gap wavelength wherein each quantum structure layer 22' substantially emits light at the wavelength of operation.

In the preferred embodiment, active region 21' is sandwiched between a cladding layer 18' and a cladding layer 24'. It will be understood that while cladding layers 18' and 24' are illustrated as including a single material layer, layers 18' and 24' can each include more than one layer. Further, in the preferred embodiment, cladding layers 18' and 24' include indium phosphide wherein cladding layer 18' is lightly doped n-type and cladding layer 24' is lightly doped p-type. However, it will be understood that layers 18' and 24' can include other suitable cladding materials with various doping configurations.

In the preferred embodiment, quantum structure layers 22' include quantum wells. However, it will be understood that layers 22' can include other device structures, such as quantum dots or similar device structures with suitable light emission properties. In the preferred embodiment, each adjacent quantum structure layer 22' in active region 21' is spaced apart by distance 11' chosen such that quantum structure layers 22' are substantially at an anti-node of an optical field in VCSEL 7' (i.e. distance 11' is approximately equal to one half the wavelength of operation or integer multiples thereof).

Further, adjacent quantum structure layers 22' are separated by a barrier layer 20' as illustrated such that a barrier layer 20a is positioned adjacent to cladding layer 24' and a barrier layer 20b is positioned adjacent to cladding layer 18'. In the preferred embodiment, an energy gap wavelength of each barrier layer 20' is smaller than the energy gap wavelength of each quantum structure layer 22'. Further, in the preferred embodiment, quantum structure layers 22' and barrier layers 20' include AlGaInAs. However, it will be understood that quantum structure layers 22' and barrier layers 20' can include alloys of AlGaInAs or other suitable light emitting materials and barrier materials, respectively.

It will be understood that in some embodiments, barrier layer 20'a positioned adjacent to cladding layer 24' can include a sufficiently low electron affinity material in order to provide improved electron confinement for active region 21'. Further, in some embodiments, barrier layer 20'b adjacent to cladding layer 18' can include a sufficiently high ionization potential material to provide improved hole confinement. The addition of barrier layers 20'a and 20'b provides a higher energy barrier against carrier leakage and carrier loss, and improves a high temperature performance of VCSEL 7'.

In the preferred embodiment, a dielectric DBR region 28' is positioned on light emitting region 23' and adjacent to cladding region 24' by using a dielectric lift-off process. However, it will be understood that dielectric DBR region 28' can be deposited using other deposition techniques well known to those skilled in the art. In the preferred embodiment, dielectric DBR region 28' includes alternate layers of a silicon oxide (SiO) layer 25' and a titanium oxide (TiO) layer 27' wherein each layer 25' and 27' has thickness 74' approximately equal to one quarter of the wavelength of operation to obtain a desired reflective property.

However, it will be understood that layers 25' and 27' can include other suitable dielectric materials which alternate between a high dielectric constant material and a low dielectric constant material, such as alternate layers of magnesium fluoride (MgF) and zinc selenide (ZnSe). Further, it will be understood that the use of a dielectric DBR region in this embodiment is for illustrative purposes only. For example DBR region 28' could include alternate layers of aluminum arsenide (AlAs) and gallium arsenide (GaAs) and be is similar in structure to metamorphic DBR region 16'.

An implant region 36' and 37' are formed within cladding layer 24' and an implant region 56' and 57' are formed within cladding layer 55' and aligned such that a light path channel 49' extends through dielectric DBR region 28', light emitting region 23', light emitting region 53', metamorphic DBR region 16', and substrate 10', as will be discussed separately. An index guide region 30' and 31' are positioned within cladding layer 24' adjacent to a surface 46' and aligned with window 14' and light path channel 49'. Index guide regions 30' and 31' can include, for example, a trench. Further, it will be understood that implant regions similar to regions 36', 37', 56', and 57' can be formed within cladding layers 54' and/or 18'. However, the formation of implant regions within cladding layers 24' and 55' is for illustrative purposes only.

Implant regions 36', 37', 56', and 57' are used to confine an electrical current to light path channel 49' to improve a single mode lasing operation. Hence, ion implantation is used to bombard some of the surrounding cladding layers 24' and 55' in order to create a region of higher resistivity, and, thereby channel most of the electrical current into the relatively more conductive light path channel 49'. The implanted ions may consist of singly-charged protons ($H^+$), singly-charged or doubly-charged helium ions ($He^+$ or $He^{++}$), or the like. The higher resistivity substantially results from the deep levels created by the implant damage, whose energy states favor the compensation of cladding layers 24' and 55'.

Index guide regions 30' and 31' are used to improve a single-mode output power of single junction VCSEL 7' by increasing the lateral cross-section of the gain region while preserving single-mode lasing operation by means of mode selection measures (mode control) that preferentially enhance the modal gain of one mode through index guiding, or alternatively suppress the other competing higher order nodes through a higher reflection loss.

By allowing the actively pumped area to increase while suppressing the competing modes that emerge through surface relief patterning, higher single-mode output power is achieved through a reduced current density, which leads to lower self-heating and reduced gain saturation.

In the preferred embodiment, dielectric DBR region 28' is etched through light emitting region 23' to form a mesa 48' and expose a surface 72' and 73'. Further, in the preferred embodiment, light emitting region 23' is etched through contact region 19' emitting region 53' to form a mesa 47' and expose a surface 70' and 71'. In the preferred embodiment, light emitting region 53' is etched through contact region 77' to form a mesa 51' and expose a surface 75' and 76'.

In the preferred embodiment, an electrical contact 58' and 59' are positioned on surfaces 76' and 75', respectively. It will be understood that electrical contacts 58' and 59' can include gold (Au), platinum (Pt), silver (Ag), or the like. Further, it will be understood that contact layers 58' and 59' are illustrated as including a single layer, but layers 58' and 59' could include multiple conductive layers of a conductive material.

In the preferred embodiment, an electrical contact 35' and 33' are positioned on surfaces 70' and 71', respectively. It will be understood that electrical contacts 33' and 35' can include gold (Au), platinum (Pt), silver (Ag), or the like. Further, it will be understood that contact layers 33' and 35' are illustrated as including a single layer, but layers 33' and 35' could include multiple conductive layers of a conductive material.

In the preferred embodiment, contact layers 42' and 43' are epitaxially deposited on surfaces 72' and 73', respectively. In the preferred embodiment, contact layers 42' and 43' include highly p-type doped InGaAs. However, it will be understood that layers 42' and 43' can include other suitable conductive materials. Further, an electrical contact 34' is positioned on contact layer 42' and an electrical contact 32' is positioned on contact layer 43' to form a pn junction 44' between electrical contacts 33' and/or 35' and electrical contacts 32' and/or 34' as illustrated. Further, a pn junction 45' is formed between electrical contacts 33' and/or 35' and electrical contacts 58' and/or 59'.

It will be understood that electrical contacts 32' and 34' can include gold (Au), platinum (Pt), silver (Ag), or the like. Further, it will be understood that in the preferred embodiment, layers 42' and 43' are n-type doped, region 19' is p-type doped, and layer 49' is n-type doped for illustrative purposes and that other doping configurations are possible. For example, layers 42' and 43' could be p-type doped, layer 19' could be n-type doped, and layer 49' could be p-type doped wherein a polarity of pn junctions 44' and 45' is reversed.

In the preferred embodiment, active regions 21' and 29' are optically cascaded in a resonant configuration to increase the overall optical-gain and to achieve high optical output power. However, pn junctions 44' and 45' are electrically biased in parallel to minimize the voltage required to operate multijunction VCSEL 7', as will be discussed presently. Further, in the preferred embodiment, light path channel 49' is defined such that a current path through active region 53' is substantially equal to a current path through active region 23' such that each active region 23' and 53' emits a substantially equal amount of light. It will be understood that a current path can be adjusted by changing the properties and positioning of implant regions 36', 37', 56', or 57', as well as index guides 30 and 31.

Figure 8:
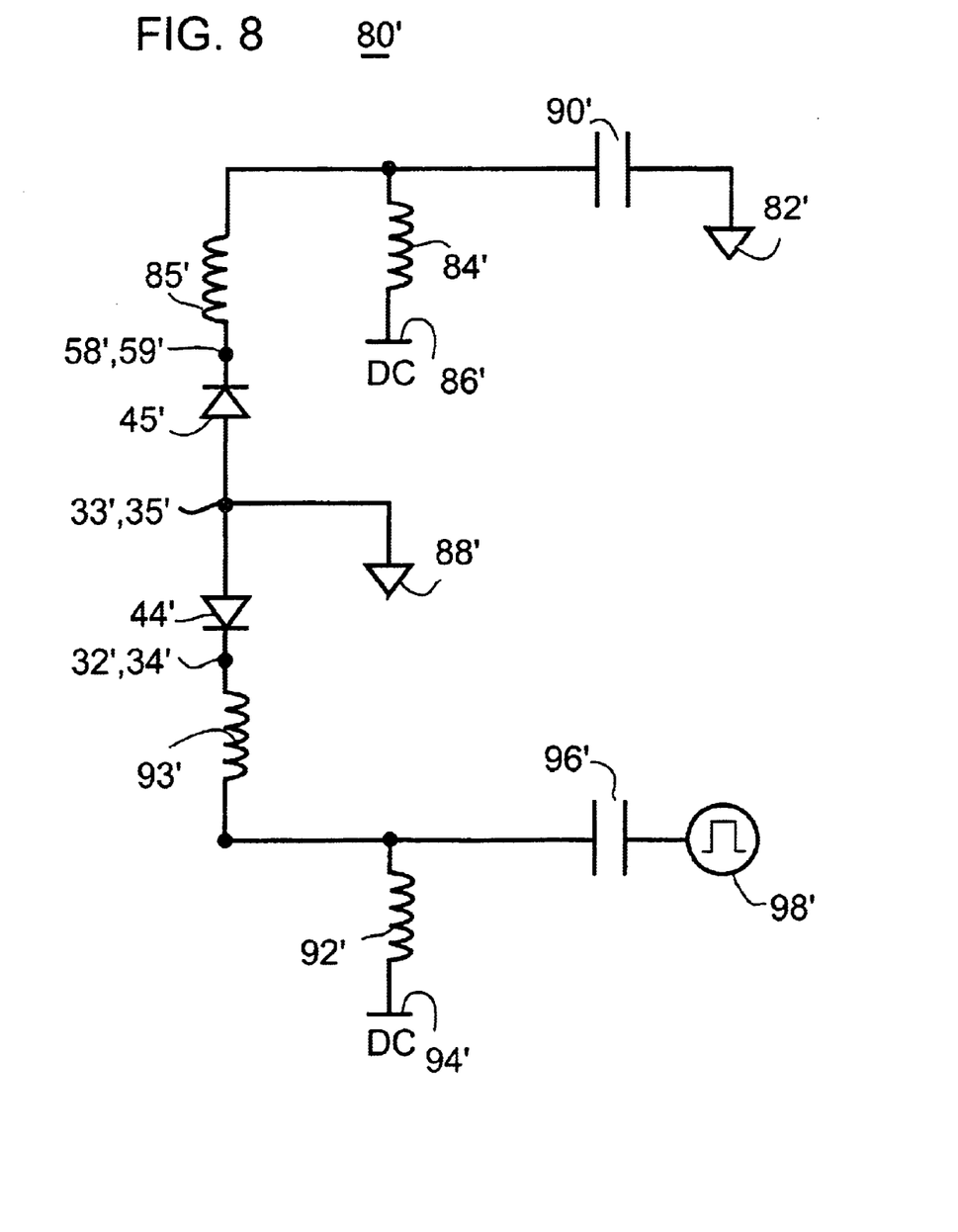
FIG. 8 is a circuit schematic of an electrooptic circuit of the multi-junction vertical cavity surface emitting laser connected to electronic modulation circuitry in accordance with the present invention.

Turn now to FIG. 8 which illustrates an electrooptic circuit 80' of multijunction VCSEL 7' connected to electronic modulation circuitry. A DC power input 94' is electrically connected to a terminal of an inductor 92'. An opposed terminal of inductor 92' is electrically connected to a terminal of a capacitor 96' and a terminal of a resistor 93'.

An opposed terminal of capacitor 96' is electrically connected to an RF power source 98'. An opposed terminal of resistor 93' is electrically connected to electrical contacts 32' and/or 34' (See FIG. 7) of multijunction VCSEL 7'. Further, a DC power return 88' is electrically connected to electrical contact 33' and/or 35' (See FIG. 7).

Electrical contacts 58' and/or 59' (See FIG. 7) of multijunction VCSEL 7' are electrically connected to a terminal of a resistor 85'. An opposed terminal of resistor 85' is electrically connected to a terminal of an inductor 84' and a terminal of a capacitor 90'. An opposed terminal of inductor 84' is electrically connected to a DC power input 86' and an opposed terminal of capacitor 90' is electrically connected to an RF power return 82'.

In electrooptic circuit 80', DC power source 86' biases pn junction 45' with a DC voltage and DC power source 94' biases pn junction 44' with a DC voltage. Inductors 84' and 92' provide an electrical short for DC signals and a high impedance for RF signals, while capacitors 90' and 96' isolate RF power return 82' and RF power source 98', respectively, from a DC current. Resistors 93' and 85' are added as current limiters and also for impedance matching when needed. RF power source 98' provides an RF voltage which modulates pn junction 44'.

Turning back to FIG. 7, active regions 21' and 29' are positioned within a resonance cavity 81' defined by metamorphic DBR mirror 16' and dielectric DBR mirror 28'. Active regions 21' and 29' are located at the antinodes of the optical field within resonance cavity 81' and emit light coherently, wherein each active region 21' and 29' contributes substantially to the overall optical gain of VCSEL 7'. PN junctions 44' and 45' are connected serially but are biased in parallel. Each pn junction 44' and 45' is biased by DC bias 94' and 86', respectively, to produce an optical gain that combines coherently to bias VCSEL 7' in close proximity to a lasing threshold. RF signal 98' supplies a modulation signal to junction 44', which functions as a "gain lever" that modulates the gain of VCSEL 7' above threshold and produces a modulated optical output.

In order to increase the power output of multifunction VCSEL 7', pn junctions 44' and 45' are optically cascaded within common optical resonance cavity 81' defined by metamorphic DBR region 16' and dielectric DBR region 28'. Placing quantum structure layers 22' and 52' at the peaks (anti-nodes) of the optical field causes the optical gains of active regions 21' and 29' to be coherently coupled, thereby increasing the overall gain of the cavity and increasing the power output.

In the preferred embodiment, active regions 21' and 29' are placed at different antinodes within the same resonance cavity, and each gain section is electrically biased individually within pn junction 44' and 45', respectively. In the preferred embodiment, pn junctions 44' and 45' are biased not in serial, but in parallel by sharing a common p$^+$ electrode (i.e. contact region 19').

In this three-terminal configuration, both pn junctions 44' and 45' are independently forward-biased by different currents through separate current paths, whose sum constitutes the total drive current. The forward-biased voltages of pn junctions 44' and 45' are each comparable to that of a single pn junction. Each current contributes a lower optical gain to the shared resonance cavity, while the collective optical gain determines the threshold lasing condition of the cavity.

In the preferred embodiment of multijunction VCSEL 7', pn junction 45' is subjected only to a DC bias, while pn junction 44' (which is substantially similar in area) is subjected to both a DC bias and a RF modulation current for high-speed operation. In this manner both pn junctions 44' and 45' are subjected to lower voltage biases and lower current injection levels, and are, thus, less prone to gain saturation.

Figure 9:
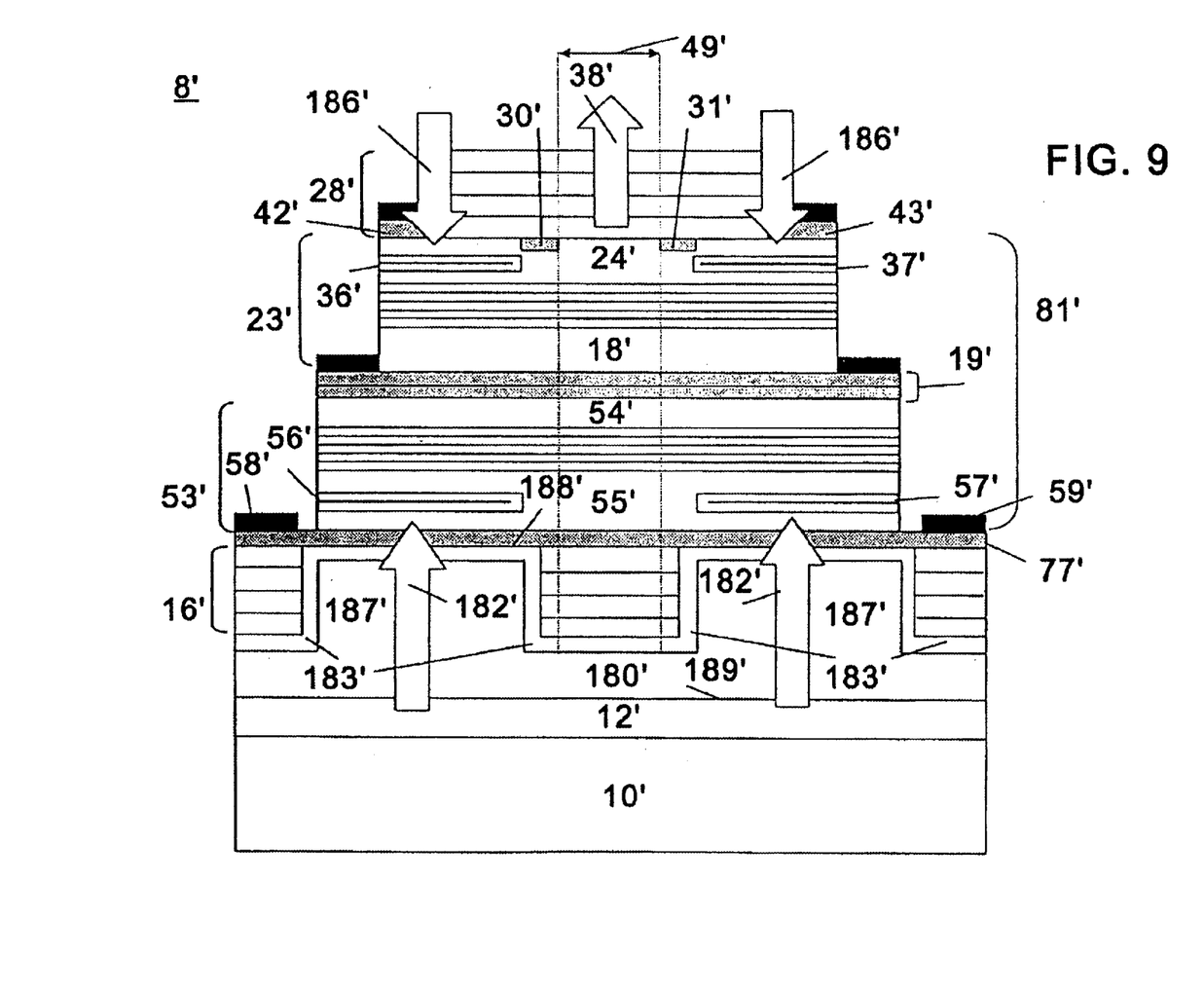
FIG. 9 is a sectional view of another embodiment of a multi-junction VCSEL in accordance with the present invention.

Turn now to FIG. 9 which illustrates another embodiment of a multijunction VCSEL 8'. It will be understood that multijunction VCSEL 8' is fabricated using similar steps in the fabrication sequence for multijunction VCSEL 7' (i.e. substrate bonding, substrate removal, etc.) and includes similar layers. However, we are illustrating the final device structure in FIG. 9 for simplicity and ease of discussion. Further, multifunction VCSEL 8' includes two active regions for simplicity and ease of discussion. However, it will be understood that multifunction VCSEL 8' can include more than two light emitting regions electrically connected in parallel.

In this embodiment, metamorphic DBR 16' is patterned into a self-enclosed etched trench 187' with a surface 188' which provides direct electrical access to contact region 77' and also provides improved carrier confinement, as will be discussed presently. In the preferred embodiment, etched trench 187' also allows cladding region 54' (or cladding region 55') to be ion implanted through bottom surface 188' in a direction 182' substantially opposite to an ion implant in a direction 186' in cladding region 24'. In the preferred embodiment, the ions implanted in direction 186' form implant regions 36' and 37' in cladding region 24' and the ions implanted in direction 182' form implant regions 56' and 57' in contact region 54'. This allows light emitting regions 23' and 53' to be implanted independently without substantially damaging contact region 19'.

In the preferred embodiment, after ion implantation and annealing, a base metal layer 183' is deposited over metamorphic DBR 16'. In the preferred embodiment, base metal layer 183' is used as a seed layer for electroplating a contact layer 180' that has a substantially planarized bottom surface 189'. It will be understood that layers 183' and 189' can include gold (Au), platinum (Pt), or the like. Further, it will be understood that base metal layer 181' and contact layer 180' can be deposited using other deposition techniques well known to those skilled in the art. In the preferred embodiment, contact layer 180' is then bonded to substrate 10' by using bonding layer 12'.

Multijunction VCSEL 8' has a lower spreading resistance which is substantially obtained through improved current confinement by forming trench 187' within metamorphic DBR 16'. The lower spreading resistance is also improved by forming implant regions 56' and 57' in cladding region 54' and implant regions 36' and 37' in cladding region 24' without substantially damaging contact region 19'. These improvements allow the current to be substantially injected through contact region 77' toward contact layers 42' and 43' and minimizes a lateral current spreading.

Figure 10:
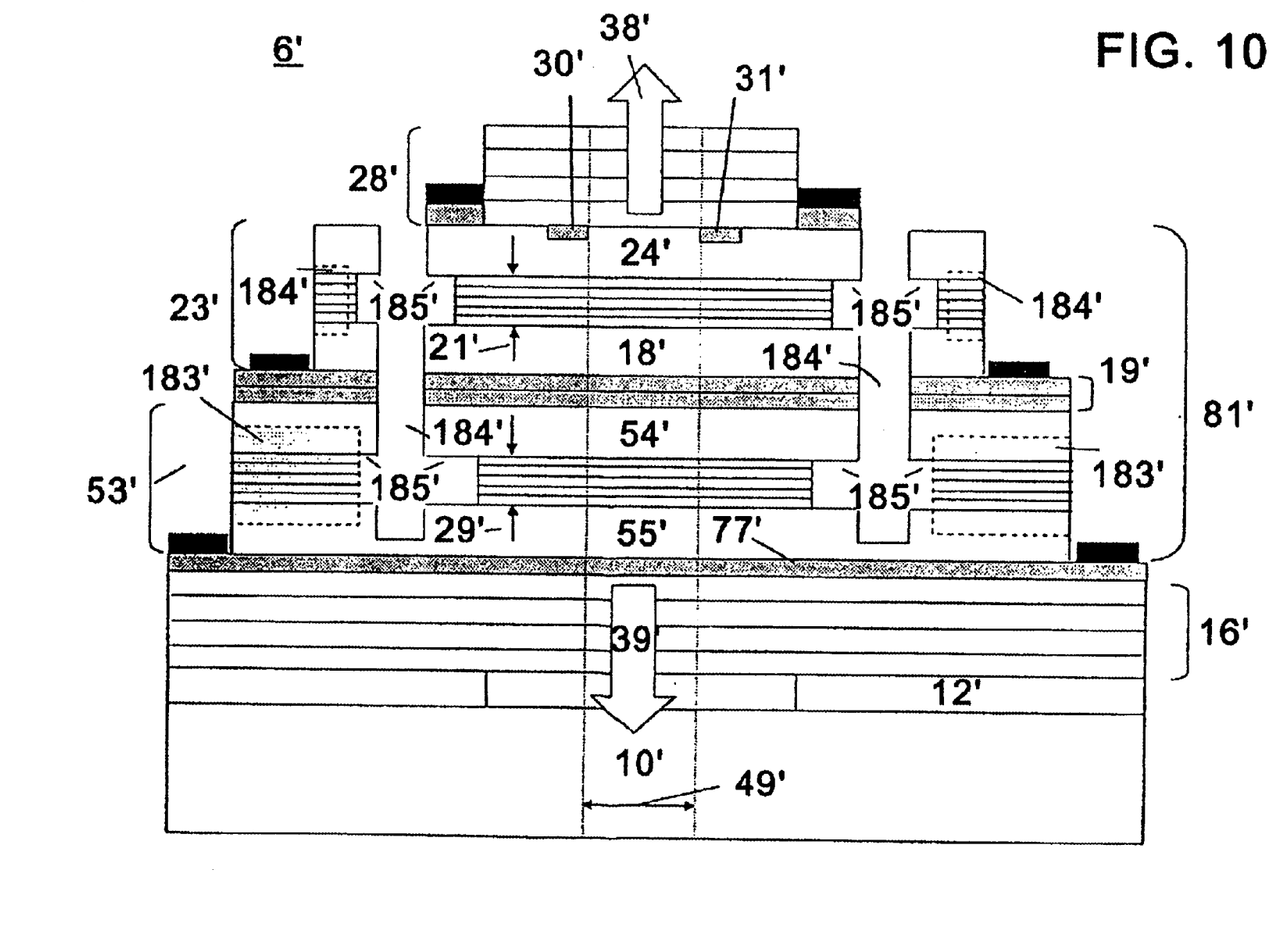
FIG. 10 is a sectional view of yet another embodiment of a multi-junction VCSEL in accordance with the present invention.
Figure 11:
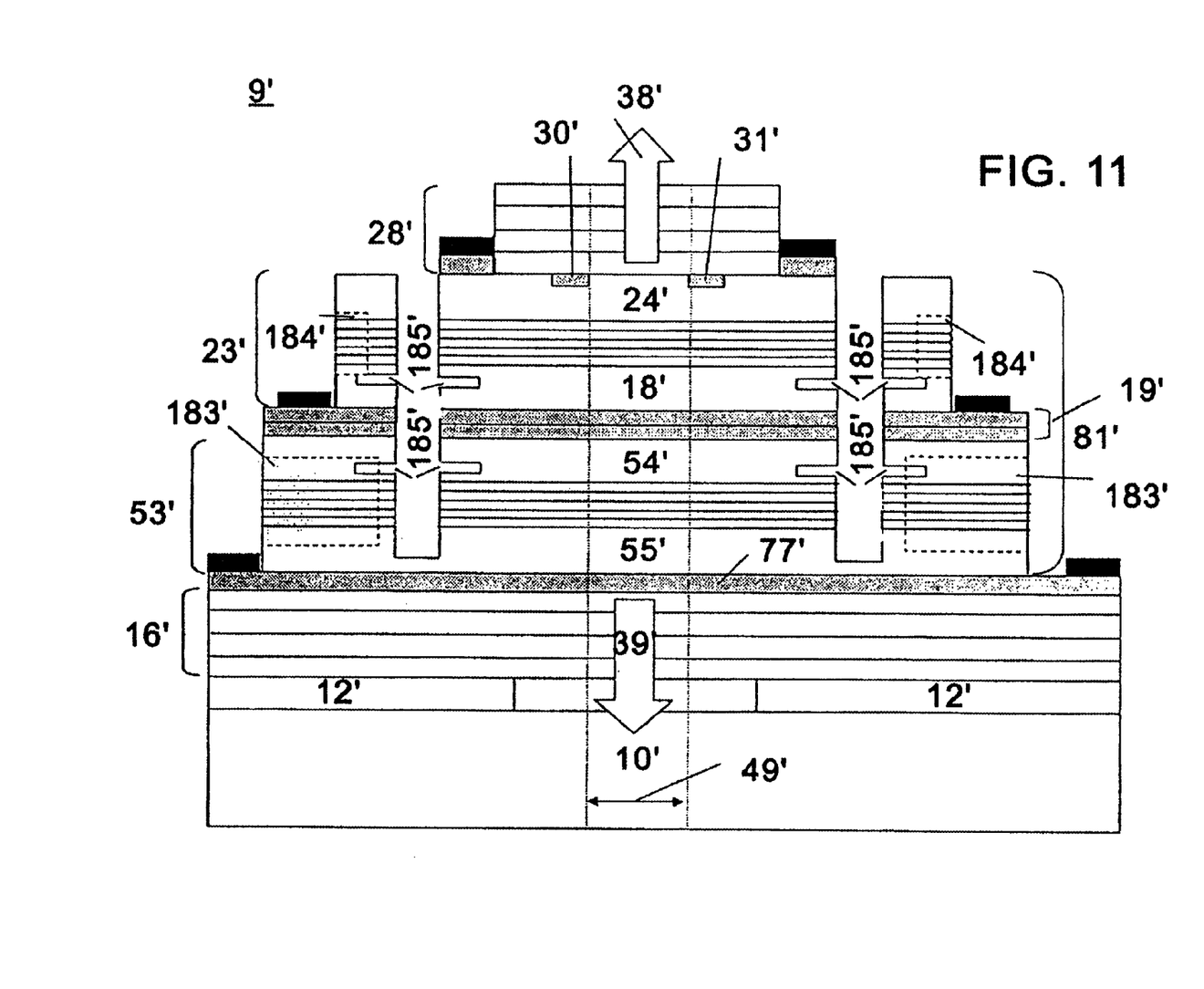
FIG. 11 is a sectional view of still another embodiment of a multi-junction VCSEL in accordance with the present invention.

An alternative means to ion implantation for current confinement is to selectively undercut active regions 21' and 29' to form a current aperture in a multijunction VCSEL 6', as illustrated in FIG. 10, or to selectively undercut a portion of cladding regions 24', 18', 54', or 55' in a multifunction VCSEL 9', as illustrated in FIG. 11. It will be understood that multifunction VCSEL's 6' and 9' are fabricated using similar steps in the fabrication sequence for multijunction VCSEL 7' (i.e. substrate bonding, substrate removal, etc.) and include similar layers. However, we are illustrating the final device structure in FIGS. 10 and 11 for simplicity and ease of discussion. Further, multifunction VCSEL's 6' and 9' include two active regions for simplicity and ease of discussion. However, it will be understood that multifunction VCSEL's 6' and 9' can include more than two light emitting regions electrically connected in parallel.

In the preferred embodiment, the undercutting is facilitated by dry etching a pattern of narrow trenches 184' through light emitting regions 23' and 53'. An undercut trench 185' can then be formed in active region 21' and/or active region 29' (See FIG. 10). Undercut trench 185' can also be formed in at least one of cladding region 55', 54', 18', and 24' (See FIG. 11). Further, in some embodiments, implant region 184' and implant region 183' can be formed proximate to trench 184', as illustrated in FIGS. 10 and 11, to provide further carrier confinement.

While the steps of the fabrication methods have been described, and will be claimed, in a specific order, it will be clear to those skilled in the art that various steps and procedures may be performed in a different order. It is intended, therefore, that the specific order described or claimed for the various fabrication steps does not in any was limit the invention and any variations in order that still come within the scope of the invention are intended to be covered in the claims.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A method of fabricating an optical device with a wavelength of operation, the method comprising the steps of:

provi­ding a first substrate;

epitaxially growing a light emitting region which emits light at the wavelength of operation, the light emitting region being positioned on the first substrate wherein the light emitting region includes an active region and a contact region of a first conductivity type and a second conductivity type such that the light emitting region is sandwiched between contact regions of opposite conductivity types;

epitaxially growing a first stack of alternate layers of a first material with a first index of refraction and a second material with a second index of refraction positioned on the light emitting region wherein the first index of refraction is substantially different from the second index of refraction so that the first stack of alternate layers forms a first mirror;

solder bonding a second substrate to the first stack of alternate layers;

removing the first substrate to substantially expose the light emitting region; and epitaxially growing a second stack of alternate layers of a third material with a third index of refraction and a fourth material with a fourth index of refraction positioned on the light emitting region wherein the third index of refraction is substantially different from the fourth index of refraction so that the second stack of alternate layers forms a second mirror.

2. A method as claimed in claim 1 wherein the step of epitaxially growing the light emitting region further includes the step of forming the active region such that the active region is positioned between a first cladding region and a second cladding region.

3. A method as claimed in claim 1 wherein the first substrate includes at least one of indium phosphide (InP) and another suitable substrate material which is lattice matched to subsequent layers grown thereon.

4. A method as claimed in claim 1 wherein the second substrate includes at least one of indium phosphide (InP), gallium arsenide (GaAs), silicon (Si), and another suitable substrate material which has suitable thermally conductive and supporting properties.

5. A method as claimed in claim 1 wherein at least one of the first and second stack of alternate layers include an alloy of AlGaAs and wherein each layer of the first, second, third, and fourth material has a thickness approximately equal to one quarter of the wavelength of operation.

6. A method as claimed in claim 1 wherein at least one of the first and second stack of alternate layers include alternate layers of silicon oxide (SiO) and titanium oxide (TiO) and wherein each layer in the alternate layers has a thickness approximately equal to one quarter of the wavelength of operation.

7. A method as claimed in claim 1 wherein at least one of the first and second stack of alternate layers include alternate layers of magnesium fluoride (MgF) and zinc selenide (ZnSe) and wherein each layer in the alternate layers has a thickness approximately equal to one quarter of the wavelength of operation.

8. A method as claimed in claim 2 wherein the active region includes a plurality of quantum structures with a bandgap wavelength substantially equal to the wavelength of operation, wherein each of the plurality of quantum structures includes at least one of quantum wells, quantum dots, and another similar quantum structure which enhances light emission.

9. A method as claimed in claim 8 wherein each quantum structure of the plurality of quantum structures is positioned between quantum barrier layers wherein each quantum barrier layer has a bandgap wavelength smaller than the bandgap wavelength of the quantum structures.

10. A method as claimed in claim 9 wherein each adjacent quantum structure of the plurality of quantum structures in the active region is spaced apart such that constructive interference occurs between each adjacent quantum structure.

11. A method as claimed in claim 8 wherein each quantum structure contains one or more barrier layers including alloys of InAlAs to provide improved carrier confinement for the double heterostructure junction.

12. A method as claimed in claim 1 wherein at least one of the first and second stack of alternate layers include alloys of AlGaAs which are continuously graded in composition to form continuously graded heterointerfaces.

13. A method as claimed in claim 2 wherein a portion of at least one of the first and second cladding regions is isolation implanted with at least one of hydrogen ions ($H^+$), helium ions ($He^+$ or $He^{++}$), and another suitable ion to form a light path channel which extends form the first stack of alternate layers to the second stack of alternate layers.

14. A method as claimed in claim 2 wherein the step of epitaxially growing the light emitting region includes the step of forming the cladding region adjacent to the second stack of alternate layers with a plurality of index guide regions to form a light path channel which extends from the first stack of alternate layers to the second stack of alternate layers, wherein the at least one index guide region is positioned adjacent to the second stack of alternate layers.

15. A method as claimed in claim 1 wherein the wavelength of operation is within a range given approximately from 1.2 $\mu$m to 1.6 $\mu$m.

16. A method as claimed in claim 1 wherein the step of solder bonding includes using a bonding layer which includes at least one of gold/silicon (Au/Si), gold/tin (Au/Sn), gold/germanium (Au/Ge), or another suitable solder material with a desired property for adhesion.

17. A method as claimed in claim 16 wherein the bonding layer includes a window to allow substantial light emission through the second substrate.

18. A method as claimed in claim 1 wherein at least one contact region of at least one of the first and second conductivity type includes at least two layers of the same conductivity type and a substantially different doping concentration.

19. A method as claimed in claim 2 further including the step of etching a trench through the light emitting region to provide substantial current confinement.

20. A method as claimed in claim 19 further including the step of forming an undercut trench adjacent to the trench and substantially extending into at least one of the active region, the first cladding region, and the second cladding region to provide substantial current confinement.

21. A method of fabricating a multijunction laser with a wavelength of operation, the method comprising the steps of:

providing a first substrate;

epitaxially growing a light emitting region which emits light at the wavelength of operation, the light emitting region being positioned on the first substrate wherein the light emitting region includes a plurality of active regions with a plurality of quantum structure layers each sandwiched between cladding regions and wherein each of the plurality of active regions is separated by alternate contact regions of a first conductivity type and a second conductivity type wherein the first conductivity type is opposite in conductivity to the second conductivity type;

epitaxially growing a first stack of alternate layers of a first material with a first index of refraction and a second material with a second index of refraction positioned on the light emitting region wherein the first index of refraction is substantially different from the second index of refraction so that the first stack of alternate layers forms a first mirror;

solder bonding a second substrate to the first stack of alternate layers;

removing the first substrate to substantially expose the at least one light emitting region; and epitaxially growing a second stack of alternate layers of a third material with a third index of refraction and a fourth material with a fourth index of refraction positioned on the light emitting region wherein the third index of refraction is substantially different from the fourth index of refraction so that the second stack of alternate layers forms a second mirror.

22. A method as claimed in claim 21 wherein at least one of the first and second stack of alternate layers include alternate layers of silicon oxide (SiO) and titanium oxide (TiO) and wherein each layer in the alternate layers has a thickness approximately equal to one quarter of the wavelength of operation.

23. A method as claimed in claim 21 wherein at least one of the first and second stack of alternate layers include alternate layers of magnesium fluoride (MgF) and zinc selenide (ZnSe) and wherein each layer in the alternate layers has a thickness approximately equal to one quarter of the wavelength of operation.

24. A method as claimed in claim 21 wherein each quantum structure layer is positioned between a quantum barrier layer wherein each quantum barrier layer has a bandgap wavelength smaller than a bandgap wavelength of the quantum structure layers.

25. A method as claimed in claim 21 wherein the step of solder bonding includes using a bonding layer which includes at least one of gold/silicon (Au/Si), gold/tin (Au/Sn), gold/germanium (Au/Ge), or another suitable solder material with a desired property for adhesion.

26. A method as claimed in claim 21 wherein each adjacent active region in the plurality of active regions includes a substantially equal current path such that each active region emits a substantially equal amount of light.

27. A method as claimed in claim 21 wherein each contact region in the alternate contact regions includes a substantially equal current path between each adjacent contact region.

28. A method of modulating a multifunction laser with a wavelength of operation, the method comprising the steps of:

epitaxially growing a light emitting region positioned within an optical gain cavity which includes a mirror and an opposed mirror, wherein the light emitting region emits light at the wavelength of operation and includes a plurality of active regions wherein each of the plurality of active regions is separated by alternate contact regions of a first conductivity type and a second conductivity type;

forming a suitable electrical contact to each alternate contact region of the first and second conductivity types;

electrically connecting a direct current power source and one of an alternating current power source and an alternating current power return to each contact region of the first conductivity type; and electrically connecting a direct current power return to each contact region of the second conductivity type.

29. A method as claimed in claim 28 wherein at least one contact region includes at least two layers of the same conductivity type and substantially different doping concentrations.

30. A method as claimed in claim 28 wherein each adjacent active region in the plurality of active regions includes a substantially equal current path such that each active region emits a substantially equal amount of light.

31. A method as claimed in claim 28 wherein each contact region in the alternate contact regions includes a substantially equal current path between each adjacent contact region.

* * * * *

UNITED STATES PATENT AND TRADEMARK OFFICE
CERTIFICATE OF CORRECTION

PATENT NO. : 6,936,486 B2
DATED : August 30, 2005
INVENTOR(S) : Cheng et al.

It is certified that error appears in the above-identified patent and that said Letters Patent is hereby corrected as shown below:

<u>Column 18,</u>
Line 22, "multifunction" should read -- multijunction --.

Signed and Sealed this

Fourteenth Day of March, 2006

JON W. DUDAS
*Director of the United States Patent and Trademark Office*